United States Patent
Zhang

(10) Patent No.: US 10,242,862 B2
(45) Date of Patent: Mar. 26, 2019

(54) POST-CMP HYBRID WAFER CLEANING TECHNIQUE

(71) Applicant: STMicroelectronics, Inc., Coppell, TX (US)

(72) Inventor: John H. Zhang, Altamont, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/391,135

(22) Filed: Dec. 27, 2016

(65) Prior Publication Data

US 2017/0110317 A1    Apr. 20, 2017

Related U.S. Application Data

(62) Division of application No. 14/047,144, filed on Oct. 7, 2013, now Pat. No. 9,548,222.

(51) Int. Cl.
*H01L 21/02* (2006.01)
*H01L 21/67* (2006.01)
*B08B 3/08* (2006.01)
*B08B 3/12* (2006.01)

(52) U.S. Cl.
CPC .......... *H01L 21/02057* (2013.01); *B08B 3/08* (2013.01); *B08B 3/12* (2013.01); *H01L 21/67028* (2013.01); *H01L 21/67046* (2013.01)

(58) Field of Classification Search
None
See application file for complete search history.

(56) References Cited

U.S. PATENT DOCUMENTS

| | | | | |
|---|---|---|---|---|
| 5,745,946 A | * | 5/1998 | Thrasher | B08B 17/00 134/200 |
| 5,778,554 A | * | 7/1998 | Jones | H01L 21/67034 34/58 |
| 5,875,507 A | * | 3/1999 | Stephens | H01L 21/67046 15/102 |
| 6,464,796 B2 | | 10/2002 | Vail et al. | |
| 2008/0135070 A1 | * | 6/2008 | Lu | B05B 7/0861 134/103.2 |
| 2011/0265816 A1 | * | 11/2011 | Chen | H01L 21/67051 134/6 |

\* cited by examiner

*Primary Examiner* — Nicole Blan
(74) *Attorney, Agent, or Firm* — Seed IP Law Group LLP

(57) ABSTRACT

A brush-cleaning apparatus is disclosed for use in cleaning a semiconductor wafer after polishing. Embodiments of the brush-cleaning apparatus implemented with a multi-branch chemical dispensing unit are applied beneficially to clean semiconductor wafers, post-polish, using a hybrid cleaning method. An exemplary hybrid cleaning method employs a two-chemical sequence in which first and second chemical treatment modules are separate from one another, and are followed by a pH-neutralizing—rinse that occurs in a treatment module separate from the first and second chemical treatment modules. Implementation of such hybrid methods is facilitated by the multi-branch chemical dispensing unit, which provides separate chemical lines to different chemical treatment modules, and dispenses chemical to at least four different areas of each wafer during single-wafer processing in an upright orientation. The multi-branch chemical dispensing unit provides a flexible, modular building block for constructing various equipment configurations that use multiple chemical treatments and/or pH neutralization steps.

16 Claims, 10 Drawing Sheets

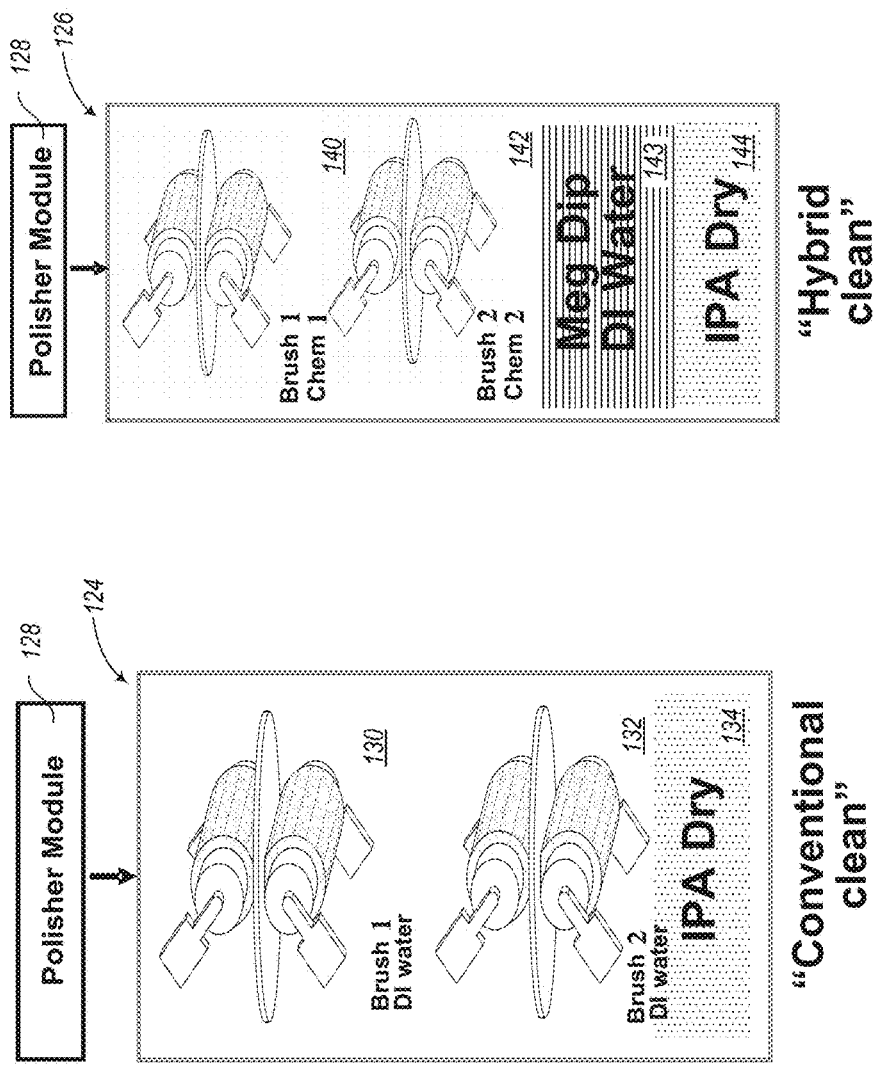
*Fig. 2B* "Hybrid clean"
*Fig. 2A (Prior Art)* "Conventional clean"

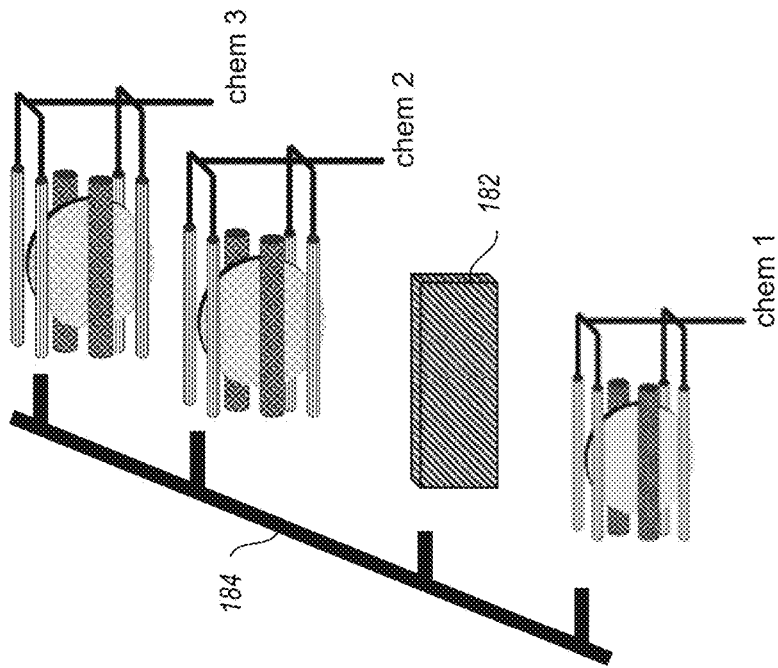
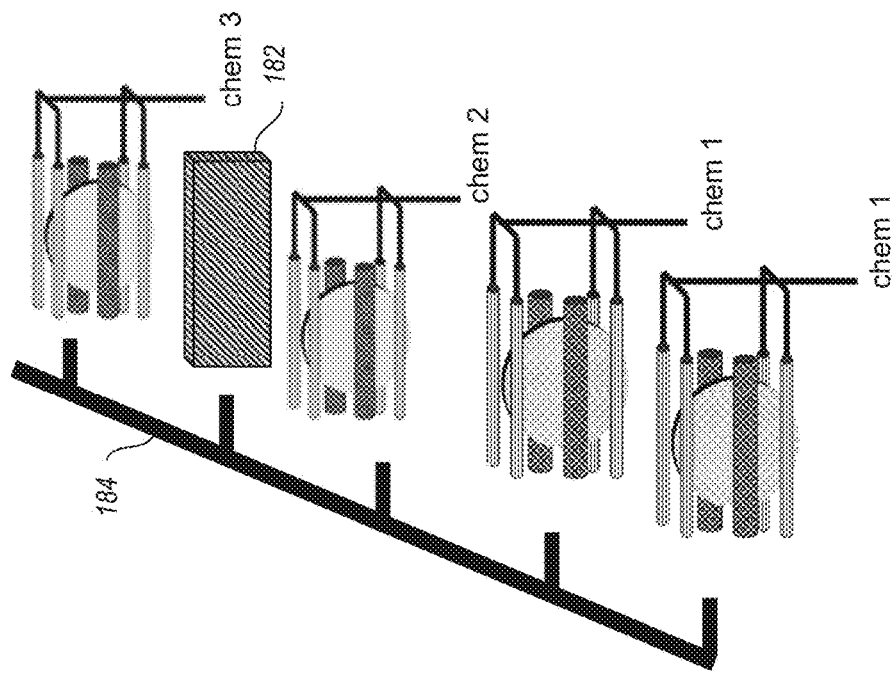

POST-CMP HYBRID WAFER CLEANING TECHNIQUE

BACKGROUND

Technical Field

The present disclosure relates to wet cleaning processes and equipment and, in particular, to wet cleaning of integrated circuit wafers in the semiconductor industry following chemical-mechanical polishing (CMP).

Description of the Related Art

Wet chemical processing and wet cleaning are frequently executed steps used to fabricate integrated circuits on semiconductor wafers. In particular, various types of wet chemical processes typically are used to etch wafers, to clean wafers following etching, to polish wafers, and to clean wafers following polishing. Wet processing equipment used in all four of these operations generally is designed to include multiple processing modules such as one or more chemical processing modules, one or more water rinse modules, and a wafer dryer. The processes and equipment needed for such wet processing operations are similar in some respects and quite different in other respects.

Some conventional wet chemical wafer cleaning operations entail immersing wafers in a tank, wet chemical processing for etching and associated post-etch cleaning. Typically, batches of wafers or single wafers are held upright in a vertical orientation within immersion tanks during wet processing. Chemical immersion tanks are typically made from non-reactive materials such as, for example, polytetrafluoroethylene (PTFE, known as "teflon"), or stainless steel. Following chemical treatment, wafers can be moved to a separate rinse module such as a water rinse tank, to receive a treatment that arrests chemical reactions occurring on the wafer surface. Water rinse tanks are also used to achieve pH neutralization following exposure of wafers to acidic or basic chemicals during processing in the chemical immersion tanks. Thus, the water tanks are exposed to chemicals used in the steps that precede the pH neutralization step, which means the water tank materials must also be resistant to such chemicals. Spray processing modules are one alternative to immersion tanks for chemical and/or water processing. Spray processing typically entails spraying individual wafers that are held in a horizontal position.

Some chemical immersion tanks and/or water rinse tanks are equipped with a sonic vibration system to assist in removing particles from wafer surfaces by vibrating the water while the wafer is submerged. Once particles are dislodged by the sonic vibrations, the particles can float away from the wafer surface. When the sonic vibration system operates at a vibration frequency in the MHz range, the process is referred to as a "megasonic" clean.

Wafer dryers can use, for example, nitrogen gas and/or a solvent such as isopropyl alcohol (IPA) to evaporate rinse water from the wafers. Additionally or alternatively, a high-speed spinning machine can drive water from the wafers by the action of a centrifugal force.

Single wafers or groups of wafers are typically transported between processing modules by one or more automated transport devices such as industrial manufacturing robots. Such robots can be designed to function in an aqueous environment and/or which may be chemically resistant. Such robots can be single axis, dual axis, or triple axis robots.

Some chemical immersion tanks and/or water rinse tanks are equipped with brushes that assist in removing particles from the wafer surfaces. Brushes are especially useful for removing slurry particles that may remain on the wafer surface after completing a CMP process. Brush cleaning typically entails scrubbing the front side of each individual wafer to remove particulates from at least partially formed integrated circuits.

Typically, neither etching nor post-etch cleaning involves scrubbing wafers with slurry or brushes. On the other hand, existing post-polish wafer cleaning equipment typically uses slurry and brushes combined with water or dilute acidic detergents, as opposed to concentrated chemicals and/or complex sequences of chemicals to clean the wafer. The design of wet cleaning equipment depends in large part on what chemicals are used. For example, the type of chemical to be used in the cleaning system determines the materials allowed for the tanks, delivery lines, hardware, filters, and even soldering methods used to plumb the delivery lines. Furthermore, different types of chemicals can require different safety features that impact equipment design. The design of post-polish cleaning equipment is therefore different from that of post-etch cleaning equipment in that the handling, delivery, and disposal of water and detergents containing particulate slurries will differ significantly from those needed for concentrated corrosive chemicals such as sulfuric acid, ethylene glycol, and the like that are typically used in post-etch cleaning.

BRIEF SUMMARY

A brush-cleaning apparatus is disclosed for use in cleaning semiconductor wafers after CMP, using a hybrid clean process. A hybrid cleaning method described employs a two-chemical sequence in which first and second chemical treatment modules are separate from one another, and are followed by a pH-neutralizing rinse that occurs in a treatment module separate from the first and second chemical treatment modules.

Embodiments of the brush-cleaning apparatus are implemented with a multi-branch chemical dispensing unit that is applied beneficially in conjunction with the hybrid cleaning method described herein as an illustrative example. Implementation of the hybrid cleaning method, as well as other multi-chemical processing sequences, is facilitated by the multi-branch chemical dispensing unit, which includes separate chemical lines to supply the different chemical treatment modules. The multi-branch chemical dispensing unit also dispenses chemical to at least four different areas of each wafer during single-wafer processing in an upright orientation. Furthermore, the multi-branch chemical dispensing unit provides a flexible, modular building block for constructing various equipment configurations that use multiple chemical treatments and/or pH neutralization steps. Use of a rail system and a pallet for changing the order of various treatment modules further facilitates experimental development of more complex processes and subsequent implementation to support manufacturing.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 2A is a high-level flow diagram illustrating a sequence of operations within a conventional post-CMP wet cleaning process, according to the prior art.

FIG. 2B is a high-level flow diagram illustrating a sequence of operations within a post-CMP hybrid wet cleaning process, as disclosed herein.

FIGS. 7A-10B are pictorial perspective views of various alternative equipment configurations that combine modular multi-branch chemical dispensing units to support different cleaning sequences, according to further embodiments described herein.

DETAILED DESCRIPTION

Figures 1A, 1B:
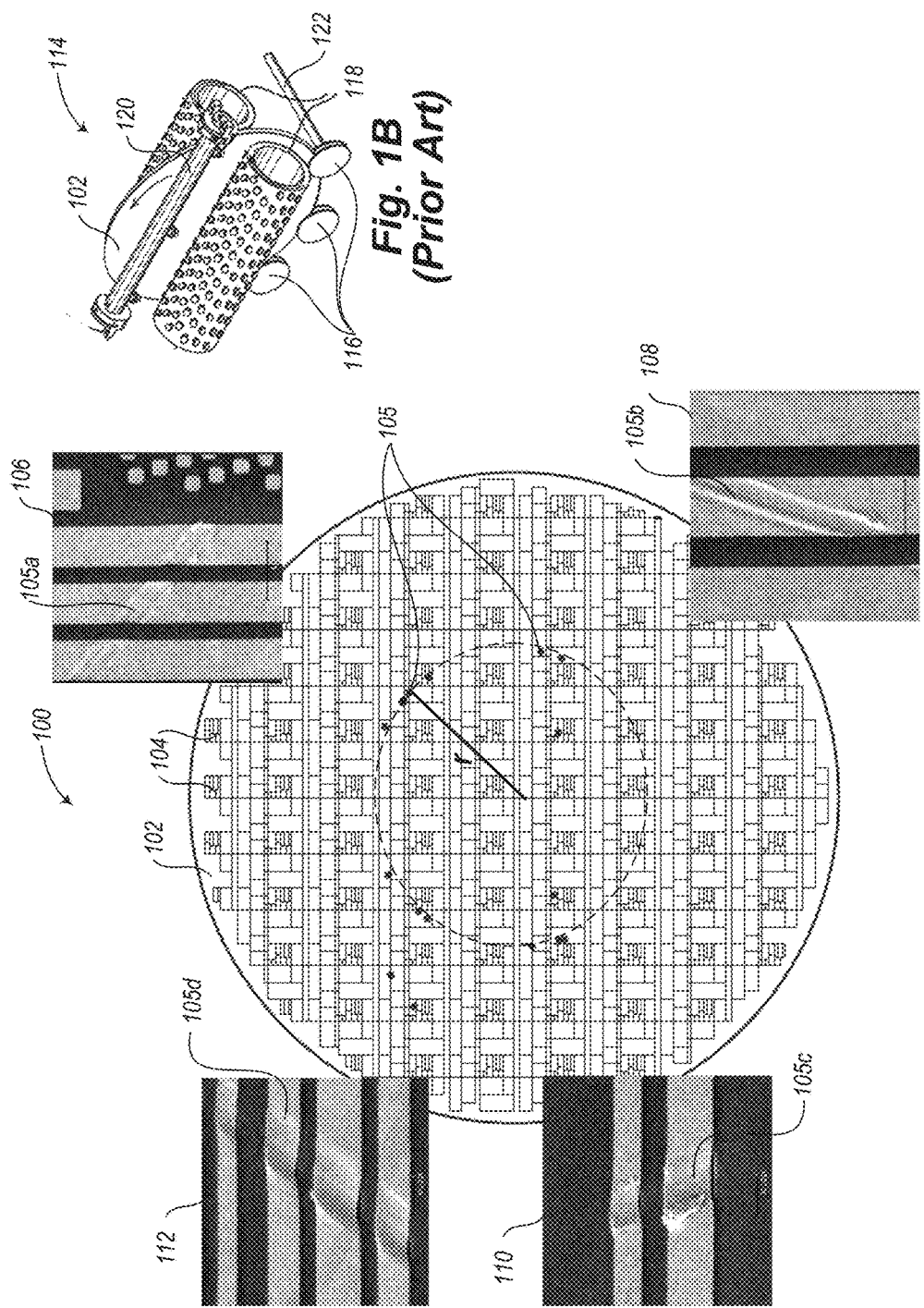
FIG. 1A is a top plan view of a semiconductor wafer map showing locations of surface defects following an in-line metrology step, with four top plan micrographs that highlight specific defects.
FIG. 1B is a perspective view of a conventional wafer cleaning brush apparatus used to scrub the wafer having the defects shown in FIG. 1A.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion etching (RIE), washing, wet cleaning, pre-cleaning, spray cleaning, scrubbing, chemical-mechanical planarization (CMP) and the like. Specific embodiments are described herein with reference to examples of such processes. However, the present disclosure and the reference to certain etching and/or polishing techniques should not be limited to those described. In some instances, two such techniques may be interchangeable. For example, stripping photoresist may entail immersing a sample in a wet chemical bath or, alternatively, spraying wet chemicals directly onto the sample.

Reference throughout the specification to processing a semiconductor wafer in a vertical orientation is synonymous with an upright orientation. For a semiconductor wafer semiconductor wafer, processing in a vertical orientation means the wafer is held on edge as opposed to lying flat. Specific embodiments are described herein with reference to equipment configurations for use in cleaning semiconductor wafers following chemical-mechanical polishing processes. However, the present disclosure and the reference to certain materials, dimensions, and the details and ordering of processing operations or processing steps are exemplary and should not be limited to those shown. The term "planarize" is used in its broadest sense, to include polishing the wafer, as well as other approaches.

In the figures, identical reference numbers identify similar features or elements. The sizes and relative positions of the features in the figures are not necessarily drawn to scale.

FIG. 1A shows an example of an in-line metrology wafer scan 100 of a silicon wafer 102 following a conventional post-CMP wet chemical cleaning process. The silicon wafer 102 bears a pattern of printed circuits 104 that are at least partially fabricated. The full wafer scan 100 shows that an exemplary ring defect mode 105 that is present on the wafer 102. In particular, the full wafer scan 100 shows a pattern of dots representing the ring defect mode 105, that lie approximately along the perimeter of a circle of radius r. Four exemplary magnification inserts 106, 108, 110, and 112 show top plan view micrographs of the wafer surface at locations corresponding to certain ones of the defects, 105$a$, 105$b$, 105$c$, and 105$d$, respectively. Under magnification, the defects 105$a$-105$d$ are recognizable as gouges. Other types of defects that may also occur following CMP include scratches, crystalline growth defects, and the like, which generally become more problematic as circuit dimensions continue to shrink.

FIG. 1B illustrates an exemplary conventional wafer cleaning brush apparatus 114 for use in post-CMP cleaning. The conventional wafer cleaning brush apparatus 114 can be mounted within a wet chemical immersion tank or within a water rinse tank, as shown in FIG. 3. The wafer cleaning brush apparatus 114 includes wafer edge rollers 116, a pair of rotating brushes 118, and a chemical dispense tube 120. The wafer edge rollers 116 are mounted on spindles 122 that set the wafer edge rollers 116 in a rotational motion. When a wafer 102 is oriented vertically in the wafer cleaning brush apparatus 114 such that the edge of the wafer 102 is in contact with the wafer edge rollers 116, counterclockwise rotation of the wafer edge rollers 116 causes counterclockwise rotation of the wafer 102. Meanwhile, the rotating brushes 118 contact opposite sides of the wafer 102 as the wafer 102 rotates. One or both of the rotating brushes 118 can also rotate against a respective surface of the wafer 102, or the rotating brushes 118 can remain fixed while the wafer rotates.

Returning to FIG. 1A, a logical conclusion consistent with the exemplary circular pattern of defects 105 is that surface particles, perhaps slurry particles from the previous CMP step, have gouged the surface of the wafer 102 during contact with one or more of the rotating brushes 118 during the post-CMP wet chemical cleaning process. Such gouges could be caused, for example, by a mis-adjustment of the brush position, or by insufficient particle removal during the cleaning operation.

In FIG. 2A, a first sequence of operations in the conventional post-CMP wet cleaning process 124 includes a first brush clean operation 130, a second brush clean operation 132 that repeats the first brush clean operation 130, and an isopropyl alcohol (IPA) drying operation 134. The first and second brush clean operations 130 and 132, respectively, use de-ionized (DI) water or a single chemical detergent. Such a conventional post-CMP wet cleaning process 124 can be used for wafers bearing circuits having a characteristic feature size of about 45 nm. The wet cleaning process 124 was used to clean the gouged wafer shown in FIG. 1A.

FIG. 2B illustrates a hybrid wet chemical cleaning process 126 according to one embodiment of the innovations disclosed herein. The sequence of operations shown in FIG. 2B is carried out following a polishing step, such as CMP. In one embodiment, the hybrid wet chemical cleaning process 126 is a sequence of operations that includes a first brush clean operation 140, a second brush clean operation 142, a DI water rinse with megasonics 143, and an isopropyl alcohol (IPA) drying operation 144. The first and second brush clean operations 140 and 142, respectively, can use, for example, two different chemicals such as a first acidic chemical and a second basic chemical. Alternatively, the first and second brush clean operations can be repeated chemical processes using the same chemical or different concentrations of the same chemical. For example, in one embodiment, the hybrid wet chemical cleaning process 126 uses an acid chemical that includes a 60:1 dilute citric acid solution, such as CX-100, available from CANI, Inc., WAKO chemical, and other industrial chemical suppliers. Such a hybrid wet chemical cleaning process 126 has been shown to reduce or substantially eliminate the exemplary ring defect mode shown in FIG. 1A, for wafers bearing circuits having a characteristic feature size of 32 nm. Experiments using the hybrid wet chemical cleaning process 126 have shown that such a process is useful in reducing or substantially eliminating other defect modes as well, at one or more layers of the 32 nm technology node process, or in fabrication processes designed for other technology nodes. Furthermore, such a hybrid wet chemical cleaning process 126 may be useful in other contexts within, or outside of, the semiconductor industry. In other industries in which the object being cleaned is volumetric instead of a wafer, a modified brush apparatus can be substituted for the wafer cleaning brush apparatus 114 described herein, with similar results.

Figure 3A:
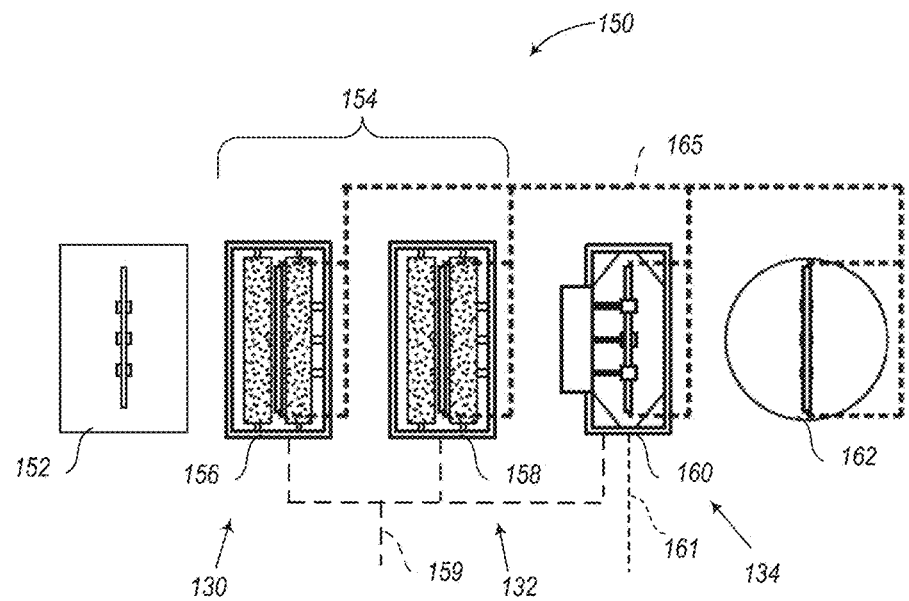
FIGS. 3A and 3B are block diagrams of equipment configurations used to execute post-CMP sequences of operations such as those shown in FIGS. 2A and 2B, respectively.

FIG. 3A illustrates an exemplary equipment configuration 150 that was used to execute the sequence of operations 130, 132, and 134 in the conventional post-CMP wet cleaning process 124 described above with respect to FIG. 2A. The equipment configuration 150 includes five modules that process one wafer 102 at a time. From left to right, the processing modules are: a wet loading station 152; a two-stage vertical double-sided brush scrubber 154 having a first brush scrubber stage 156 that carries out the first brush clean operation 130; a second brush scrubber stage 158 that carries out the second clean operation 132; a vertical spin rinse dryer 160; and a dry unload station 162. The brush scrubber stages 156 and 158 contain DI water supplied by the DI water lines 159. The vertical spin rinse dryer 160 is also supplied by the DI water supply line 159, as well as a local source of IPA via IPA line 161. The dotted lines 165 indicate transfer paths of wafers through the various modules, for increased throughput.

At the wet loading station 152, a wet robot loads a single wafer 102 into the first brush scrubber stage 156 of the two-stage vertical double-sided brush scrubber 154. In the first stage 156, the wafer 102 receives "rough" processing in a relatively dirty tank containing DI water, in which particles tend to accumulate. The first brush scrubber stage 156 may be dirty despite use of a filter, continuous replenishing of the DI water, and other such measures. Subsequently, the wafer 102 is loaded into the second brush scrubber stage 158 of the two-stage vertical double-sided brush scrubber 154, for second stage cleaning processing in a relatively clean tank also containing DI water. Inside the first and second brush scrubber stages 156 and 158, the DI water lines 159 terminate in water dispense tubes 120 for dispensing DI water at two locations on opposite sides of the wafer 102. Rotating brushes 118 are positioned to scrub both sides of the wafer 102 at the same time. Next, the wafer 102 is transferred to the vertical spin rinse dryer 160 where the wafer 102 is immersed in isopropyl alcohol vapor at the drying operation 134, while spinning at high speed to drive off moisture. Finally, the wafer 102 exits the equipment configuration 150 via the dry unload station 162, where a dry robot flips the wafer 102 to a horizontal orientation and unloads the wafer 102. Processing carried out using the equipment configuration 150 is limited to water-based processing because there are no chemical supply lines feeding either of the brush scrubber stages 156 and 158. In addition, the water is delivered to only one location on either side of the wafer.

Figure 3B:
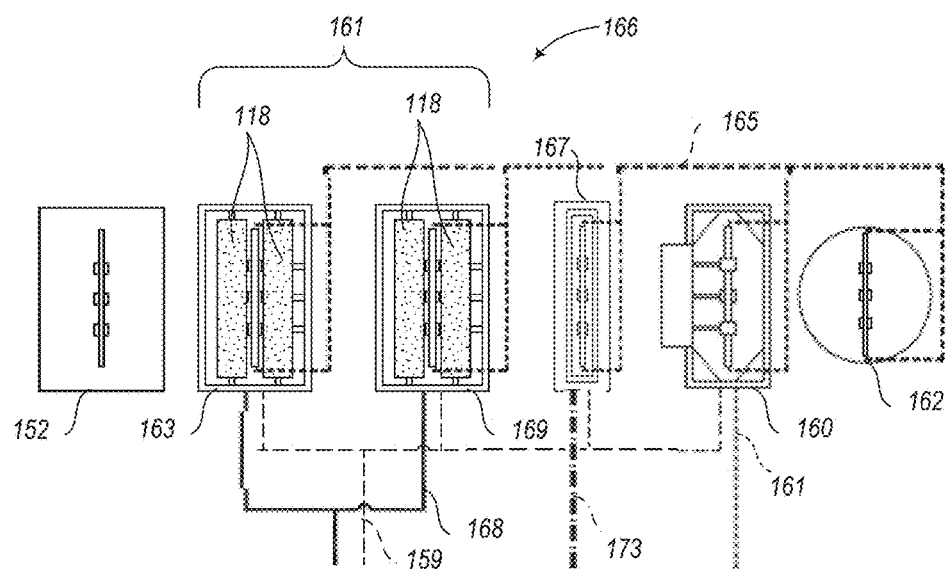

FIG. 3B illustrates one exemplary equipment configuration 166 that would be desirable to use in executing the sequence of operations 140, 142, 143, and 144 in the hybrid post-CMP wet chemical cleaning process 126 described with respect to the inventive concepts of FIG. 2B. The equipment configuration 166 includes six modules that process one wafer 102 at a time. From left to right, the processing modules include: the wet loading station 152, a two-stage vertical double-sided brush scrubber 161 having a first brush scrubber stage 163 that carries out the first brush clean operation 140; a second brush scrubber stage 169 that carries out the second brush clean operation 142; a vertical megasonic tank 167 that carries out the DI water rinse with megasonics 143, the vertical spin rinse dryer 160 that carries out the drying operation 144, and the dry unload station 162. The brush scrubber stages 163 and 169 contain a chemical supplied by the chemical supply line 168, or DI water supplied by the DI water lines 159. The vertical spin rinse dryer 160 is also supplied by the DI water supply line 159, as well as a local source of IPA via IPA line 161. The dotted lines 165 indicate transfer paths of wafers through the various modules, for increased throughput.

At the wet loading station 152, a wet robot loads a single wafer 102 into the first brush scrubber stage 163 of the two-stage vertical double-sided brush scrubber 161. In the first stage 163, the wafer 102 can receive chemical processing or water processing. Subsequently, the wafer 102 is loaded into the second brush scrubber stage 169 of the two-stage vertical double-sided brush scrubber 161, for second stage cleaning. In the second stage 169, the wafer 102 can receive chemical processing or water processing. Next, the wafer 102 is transferred to the vertical spin rinse dryer 160 where the wafer 102 is immersed in isopropyl alcohol while spinning at high speed to drive off moisture. Finally, the wafer 102 exits the equipment configuration 166 via the dry unload station 162, where a dry robot flips the wafer 102 to a horizontal orientation and unloads the wafer 102.

Figure 4:
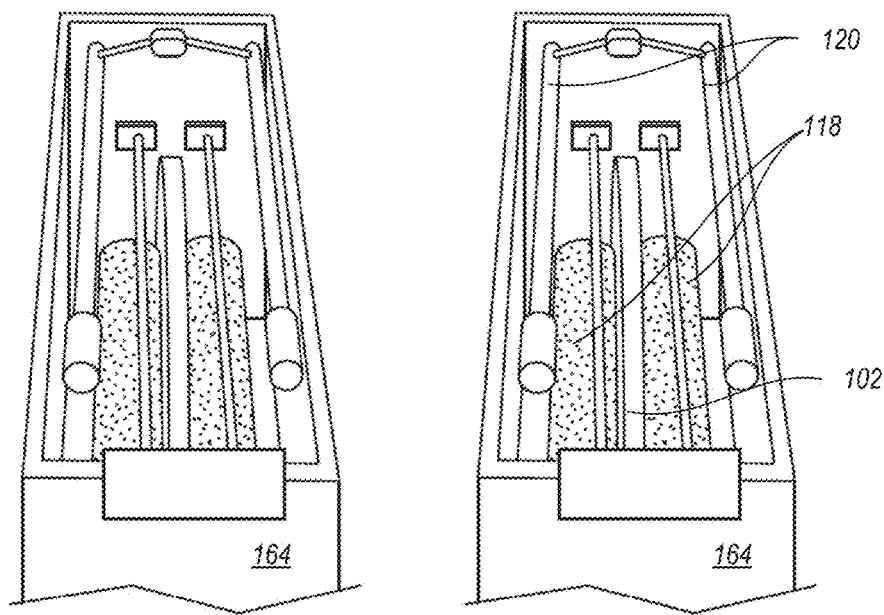
FIG. 4 is a pictorial perspective view of tanks shown in FIG. 3B and described herein.

FIG. 4 shows a perspective view of tanks 164, containing the double-sided brush scrubber stages 163 and 169. The double-sided brush scrubber stages 163 and 169 may include an alignment mechanism that is configured to position the semiconductor wafer 102 in a vertical orientation. Processing carried out using the equipment configuration 166 is limited to water-based processing or processing with one chemical because there is only one set of shared chemical delivery lines 168 feeding both of the brush scrubber stages 163 and 169. In addition, chemical is delivered to only one location on either side of the wafer. Inside the first and second brush scrubber stages 163 and 169, the shared set of chemical delivery lines 168 terminate in chemical dispense tubes 120 for dispensing chemical at two locations on opposite sides of the wafer 102. Rotating brushes 118 are positioned to scrub both sides of the wafer 102 at the same time. The shared set of chemical delivery lines 168 feed both of the brush scrubber stages 156 and 158 and that the dispense tubes 120 dispense chemical to only two locations—one adjacent to the top of the front side of the wafer 102 and one adjacent to the top of the back side of the wafer 102. Thus, processing options are limited by the structure of the chemical delivery system used in the equipment configuration 166. With such a limited configuration, it is not possible to implement the hybrid post-CMP wet chemical cleaning process sequence 126 as desired because separate chemical lines are not provided to each of the two processing tanks 164.

Figure 5:
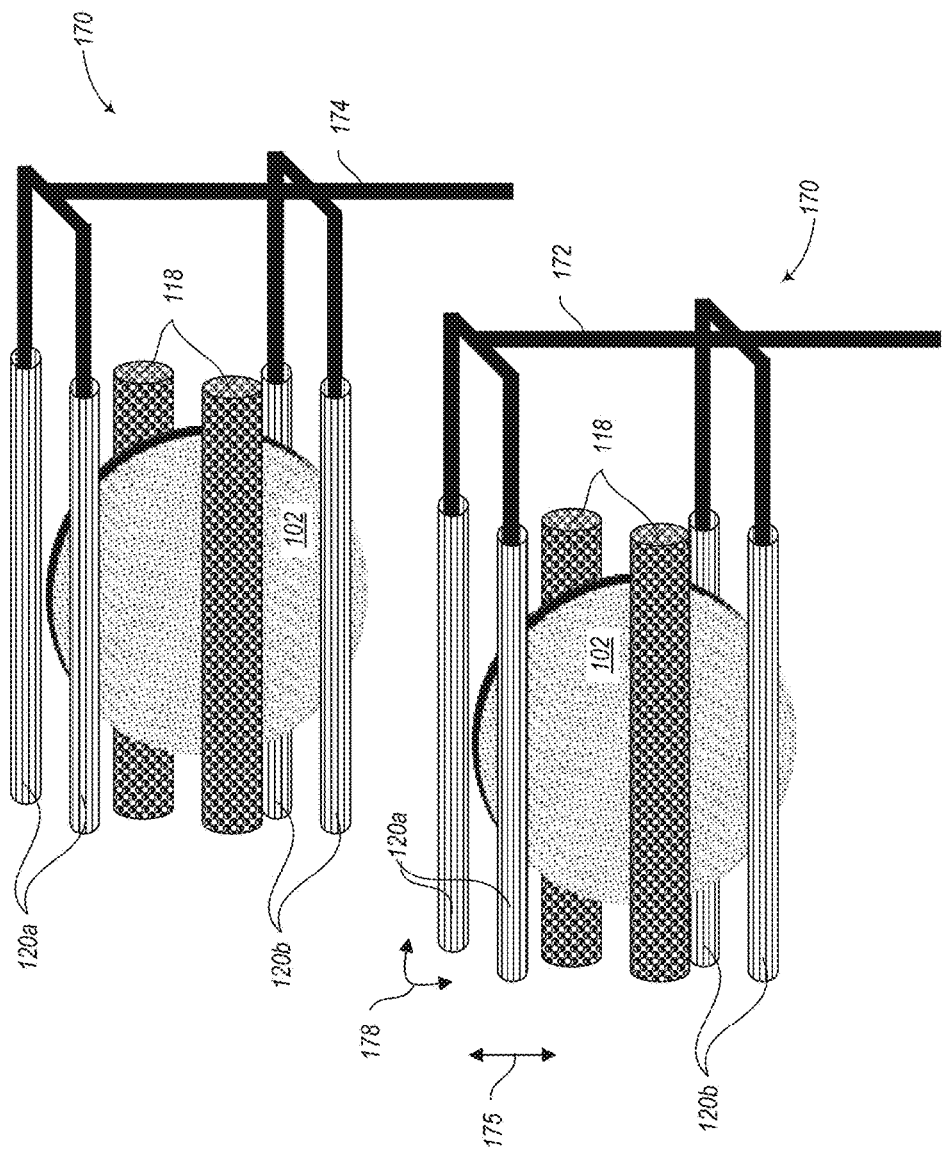
FIG. 5 is a detailed process flow diagram showing steps in a post-CMP hybrid wet cleaning process as described herein.

FIG. 5 shows a first embodiment of a modular, multi-branch chemical dispensing unit 170 that can be substituted for the shared set of chemical delivery lines 168 inside the two-stage vertical double-sided brush scrubber 161. Such a modular approach supports execution of the hybrid post-CMP cleaning process and other types of cleaning processes. Use of the multi-branch chemical dispensing units 170 permits a first set of chemical delivery lines 172 to supply the first brush scrubber stage 163 and a second set of chemical delivery lines 174 to the second brush scrubber stage 169. Use of separate chemical delivery lines for the first and second stages allows use of different chemical treatments at these stages instead of simply having a first "dirty" stage and a second "clean" stage of the same chemical treatment, and/or a water rinse. For example, the first set of chemical delivery lines 172 can be plumbed with an acid and the second chemical delivery lines 174 can be plumbed with a base to support a hybrid cleaning sequence. In addition, use of a second chemical in the second brush scrubber stage 158 can passivate the wafer surface by inhibiting the first chemical reaction faster than use of a wafer rinse which simply dilutes the previous chemical but may not stop the chemical reaction completely.

Furthermore, the multi-branch chemical dispensing unit 170 provides four chemical dispense tubes 120 in each tank 164 instead of two chemical dispense tubes. A pair of chemical dispense tubes 120a are mounted on an upper branch, and a pair of chemical dispense tubes 120b are mounted on a lower branch of each multi-branch dispensing unit 170. The multi-branch chemical dispensing unit 170 thus allows fresh chemical to reach more areas of the wafer 102 substantially simultaneously, resulting in a more uniform process, and higher particle removal efficiency. In addition, vertical positions 175 of the chemical dispense tubes 120 along each branch of the multi-branch chemical dispensing unit 170 can be adjusted for best chemical dispersion efficiency. Also, use of the multi-branch chemical dispensing unit 170 permits measurement and adjustment of a distance of the chemical dispense tubes 120 from the wafer surface. For example, when dispensing a second chemical, the at least two chemical dispensing tubes may be moved to be, a second, different distance from the wafer. One or more of the first and second chemicals includes a surfactant. The measurement and adjustment can be performed by an alignment mechanism internal to the tank 164. As a result, the hybrid post-CMP wet chemical cleaning process 126, when operated using the equipment configuration 166 in which the two-stage vertical double-sided brush scrubber 161 is configured with multi-branch chemical dispensing units 170, has been shown to substantially reduce the ring defect 105 as well as other defects at multiple post-CMP cleaning operations, as demonstrated by in-line wafer metrology scans.

Figure 6:
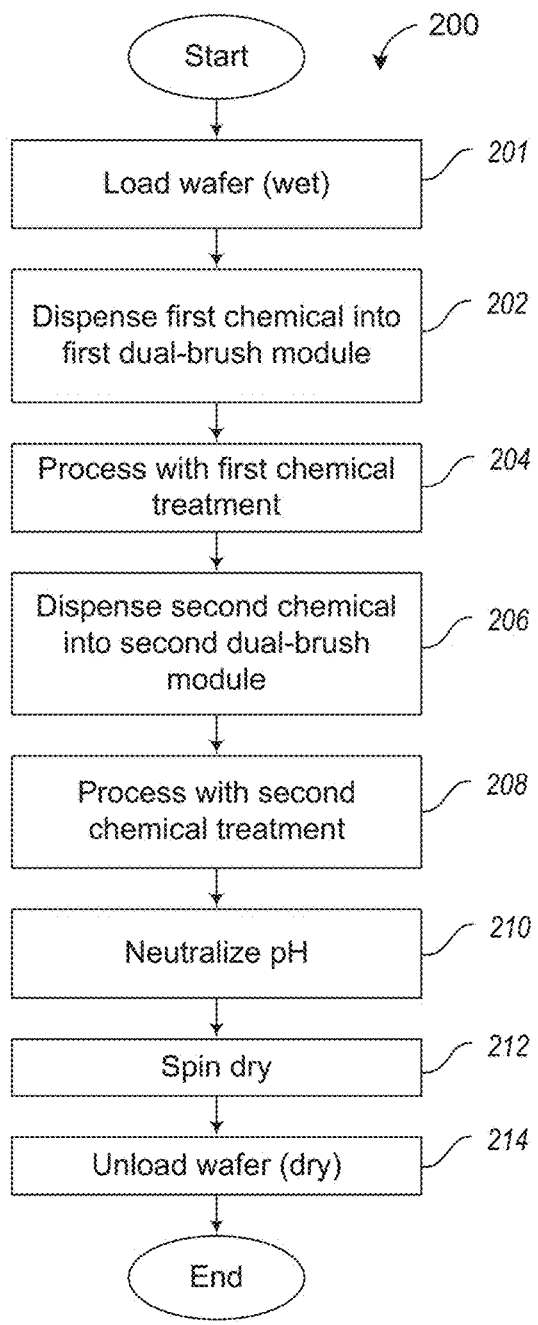
FIG. 6 is a pictorial perspective view of a modular multi-branch chemical dispensing unit for use in re-configuring the equipment configuration shown in FIG. 3B to run the post-CMP hybrid wet cleaning process described herein.

FIG. 6 shows a sequence of steps 200 in the exemplary hybrid post-CMP wet chemical cleaning process 126 according to one embodiment.

At 201, a single wafer 102 enters the equipment configuration 166 via the wet loading station 152 and is transferred into the first brush scrubber stage 163 of the two-stage vertical double-sided brush scrubber 161. In the first brush scrubber stage 163, a first chemical is dispensed into the first dual-brush module at 202.

At 204, the wafer 102 then receives chemical processing in the first chemical, for example, a solution containing 25% citric acid. Other acid solutions may be used. The wafer 102 is then loaded into the second brush scrubber stage 169 of the two-stage vertical double-sided brush scrubber.

At 206, a second chemical is dispensed into the second dual-brush module.

At 208, the wafer receives chemical processing in the second chemical, for example, a base solution. The base can contain sodium bicarbonate, or another base chemical.

At 210, the wafer is transferred to the vertical megasonic tank 167 to cease the second chemical reaction and to neutralize the pH of the wafer surface. The vertical megasonic tank 167 contains a neutralizing solution such as DI water that is supplied by the DI water supply lines 159. In the vertical megasonic tank 167, sonic vibrations dislodge remaining slurry particles prior to the drying operation. Alternatively, the vertical megasonic tank 167 can be filled with a chemical via a neutralization chemical supply line 173 to provide megasonics-enhanced chemical processing.

At 212, the wafer 102 is transferred to the vertical spin rinse dryer 160 where the wafer 102 is immersed in isopropyl alcohol (IPA) vapor while spinning at high speed to drive off moisture. IPA is supplied to the vertical spin rinse dryer 160 via the local dryer chemical supply line 161.

At 214, the wafer 102 exits the equipment configuration 166 via the dry unload station 162.

Figure 7:
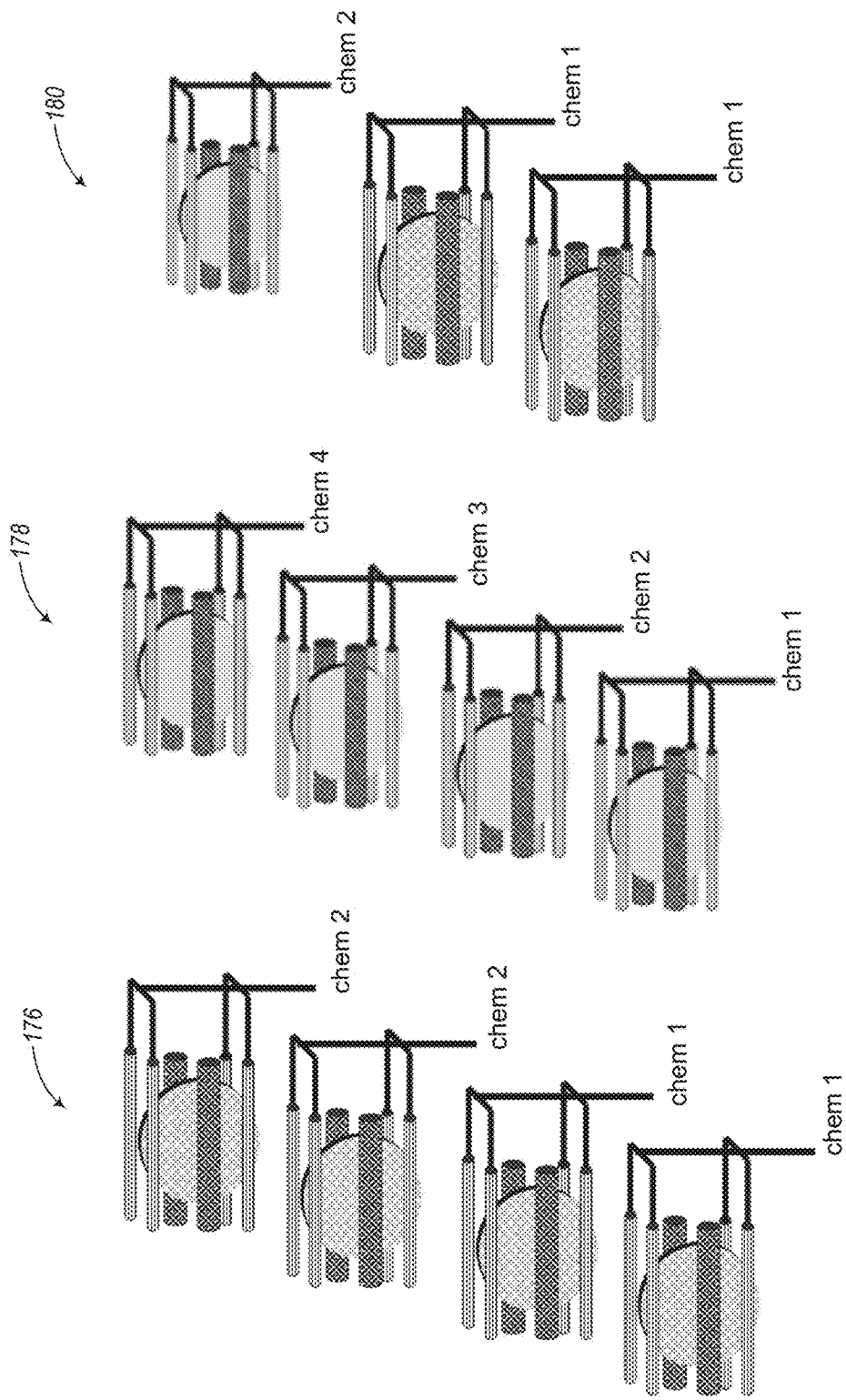

In a second exemplary embodiment shown in FIGS. 7A-7C, groups of multi-branch chemical dispensing units 170 are combined to support different types of hybrid cleaning processes. For example, FIG. 7A shows a dual-hybrid cleaning sequence 176 in which four of the multi-branch chemical dispensing units 170 are used to process the wafer 102 twice through each of two different chemicals. FIG. 7B shows a quad-hybrid cleaning sequence 178 in which four of the multi-branch chemical dispensing units 170 are used to process the wafer 102 through a succession of four different chemicals. FIG. 7C shows a tri-hybrid cleaning sequence 180 in which three of the multi-branch chemical dispensing units 170 are used to process the wafer 102 through one chemical twice and through another chemical once. Thus, the use of the multi-branch chemical dispensing units 170 affords great flexibility in building the best and most efficient cleaning sequence at each layer in the overall integrated circuit fabrication process.

Figure 8:
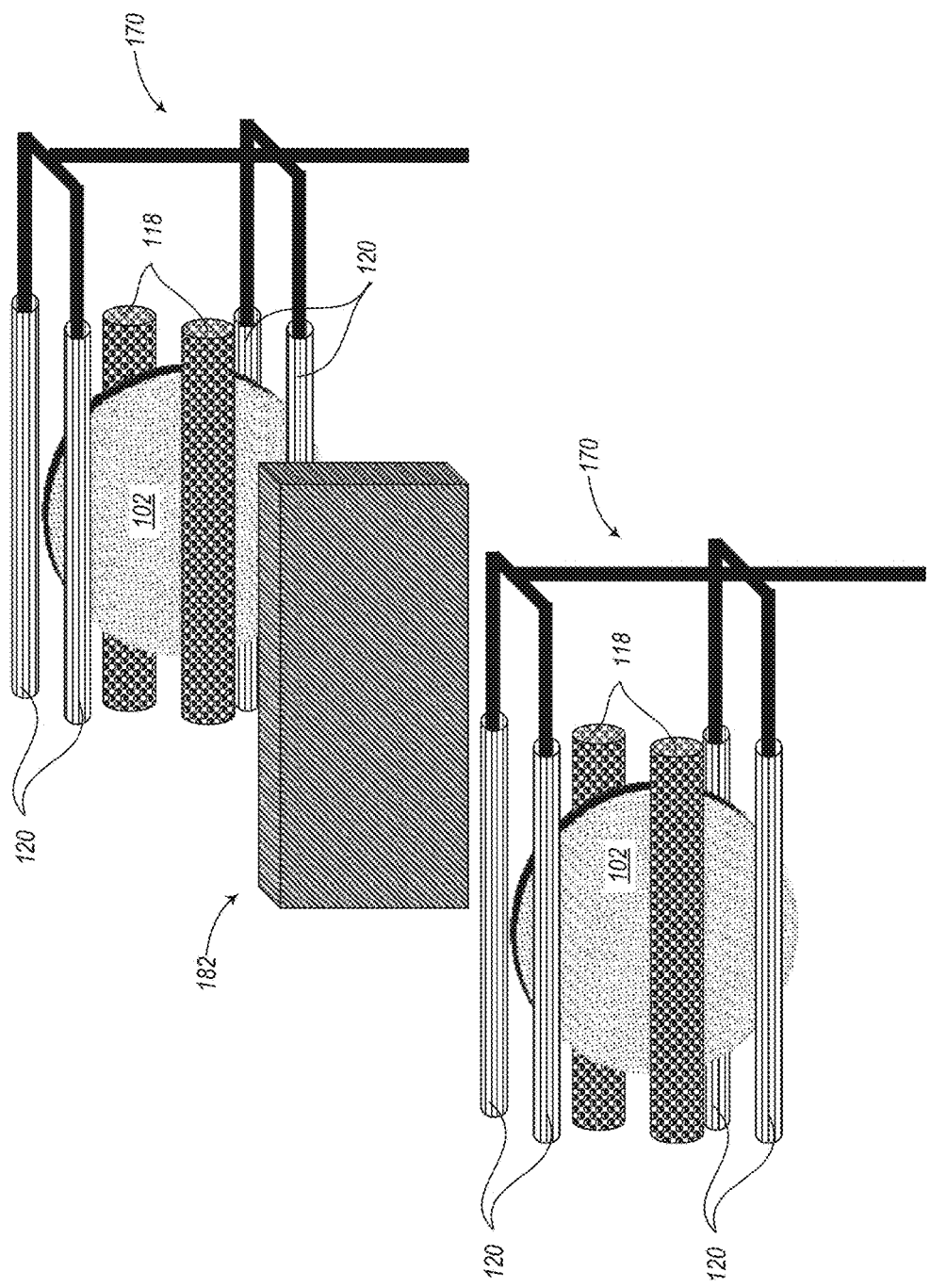

In a third exemplary embodiment shown in FIG. 8, two multi-branch chemical dispensing units 170 are combined to support a hybrid cleaning process in which a neutralization module 182 that may contain for example, water, a dilute acid, or a dilute base, is inserted between the two multi-branch chemical dispensing units 170. Using such a configuration, the wafer is immersed in a liquid in a tank so it can be pH-neutralized before it moves from a first brush cleaning step that uses, for example, an acidic chemical, to a second brush cleaning step that uses, for example, a basic chemical. The addition of such a neutralization operation prevents pH shock-induced defects from forming on the surface of the wafer 102. Shock-induced defects can cause surface charge to accumulate on the wafer 102, for example. The neutralization module 182 can be configured using either a regular tank or a megasonics tank that are full of liquid into which the wafer is immersed.

Figure 9B:
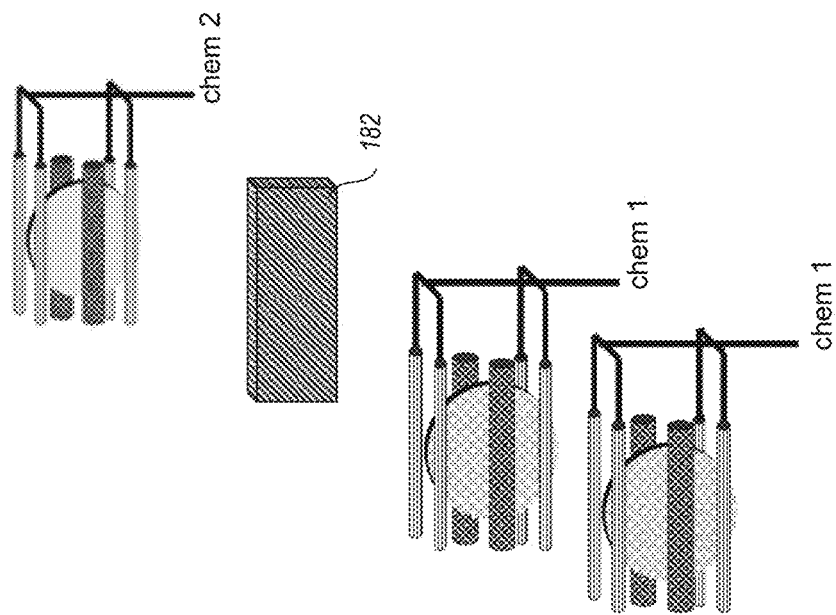
Figure 9A:
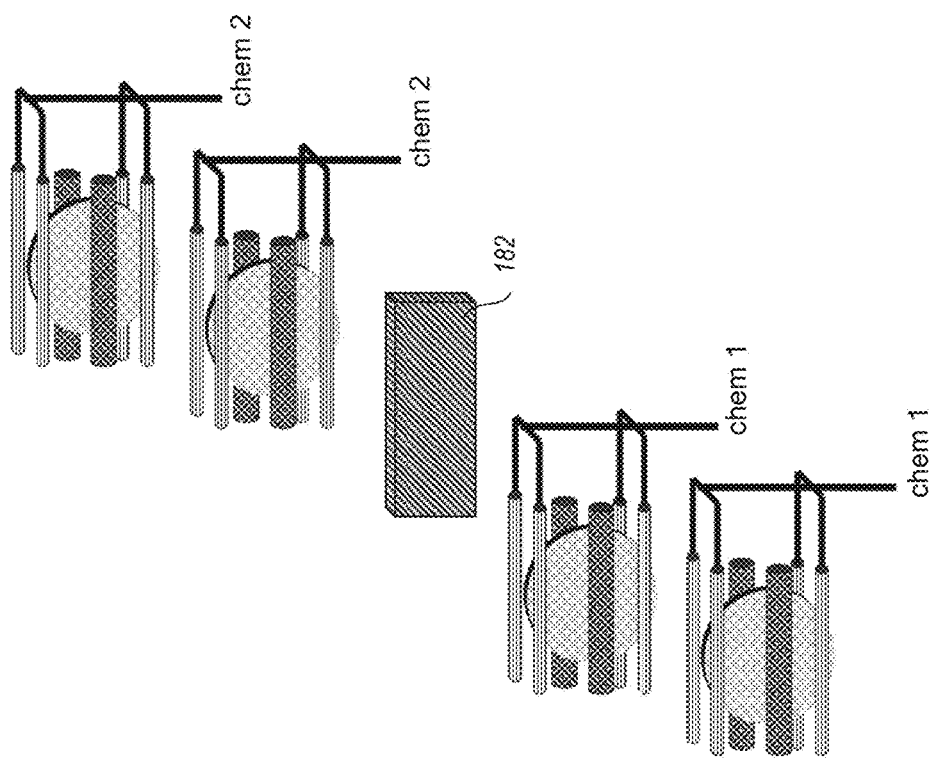

In a fourth exemplary embodiment shown in FIGS. 9A-9B, three or four multi-branch chemical dispensing units 170 are combined to support a hybrid cleaning process in which a neutralization module 182 containing, for example, water, a dilute acid, or a dilute base, is inserted between multiple multi-branch chemical dispensing units 170. For example, FIG. 9A illustrates use of the neutralization module 182 following dual processing by a first chemical, and preceding dual processing by a second chemical. FIG. 9B illustrates use of the neutralization module 182 following dual processing by a first chemical, and preceding single processing by a second chemical. In the fourth embodiment, the neutralization module 182 can be inserted among pairs of multi-branch chemical dispensing units 170 to achieve an efficient hybrid cleaning process.

In a fifth exemplary embodiment shown in FIGS. 10A-10B, further flexibility is provided by the use of a rail system 184 to switch positions of the neutralization module 182 or any one of the multi-branch chemical dispensing units 170 so as to change the order of operations within the wafer cleaning process. For example, FIG. 10A illustrates use of the neutralization module 182 inserted to follow dual processing by a first chemical and single processing by a second chemical, and to precede single processing by a third chemical. FIG. 10B illustrates use of the neutralization module 182 inserted to follow single processing by a first chemical and to precede dual processing by a second chemical. To move from the sequence shown in FIG. 10A to the sequence shown in FIG. 10B, the first chemical processing module can be removed, the third chemical module can be plumbed with the second chemical, and the neutralization module 182 can be placed on a track and transported via the rail system 184 to the position shown between the first and second chemical processing modules. In particular, a car, pallet, or holder is mounted on tracks that form the rail system 184. The module 182 can be moved to any location in the sequence of cleaning stations to provide the desired neutralizing clean. Similarly, the various stations 163 and 169 can be moved as well.

The use of multi-branch chemical dispensing units 170 in conjunction with one or more neutralization modules 182 and the rail system 184 thus greatly facilitates experimentation with different cleaning sequences during development and/or manufacturing of wet cleaning processes.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor wafer cleaning method, comprising:
dispensing a first chemical from at least two chemical dispensing tubes onto at least four locations on a semiconductor wafer within a first chemical treatment module with the chemical dispensing tubes positioned a first distance from the wafer;
rotating a pair of brushes while in contact with the semiconductor wafer while the semiconductor wafer is positioned vertically in the first chemical treatment module, the wafer being between the pair of rotating brushes, the pair of brushes and the at least two chemical dispensing tubes being oriented in substantially a same direction;
moving the at least two chemical dispensing tubes to be, a second, different distance from the wafer;
dispensing a second chemical from the at least two chemical dispensing tubes onto at least four locations on the wafer within the first chemical treatment module with the chemical dispensing tubes positioned the second distance from the wafer;
dispensing a pH level neutralizing liquid onto a surface of the semiconductor wafer;
spinning the semiconductor wafer in a dryer module; and moving the wafer to a second, separate chemical treatment module;
dispensing a third chemical that is different from the first chemical, the second chemical and the pH level neutralizing liquid from at least two chemical dispensing tubes located in the second chemical treatment module onto at least four locations on the semiconductor wafer with the at least two chemical dispensing tubes of the second chemical treatment module positioned a first distance from the wafer; and
rotating a pair of brushes while they are in contact with the semiconductor wafer while the semiconductor wafer is positioned vertically in the second chemical treatment module, the wafer being between the pair of rotating brushes.

2. The semiconductor wafer cleaning method of claim 1 wherein dispensing the first chemical includes dispensing an acid.

3. The semiconductor wafer cleaning method of claim 1 wherein dispensing the second chemical includes dispensing a base.

4. The semiconductor wafer cleaning method of claim 1, further comprising vibrating the semiconductor wafer within a sonic vibration module while it is positioned in the second chemical treatment module.

5. The semiconductor wafer cleaning method of claim 1, further comprising neutralizing a pH level on a surface of the semiconductor wafer prior to dispensing the second chemical.

6. The semiconductor wafer cleaning method of claim 1 wherein the neutralizing includes flushing the semiconductor wafer with pH balanced water.

7. The semiconductor wafer cleaning method of claim 1 wherein one or more of the first and second chemicals includes a surfactant.

8. The semiconductor wafer cleaning method of claim 1 further including:
applying a solvent to the semiconductor wafer during the spinning step.

9. The semiconductor wafer cleaning method of claim 1, further comprising repeating one or more acts of dispensing the first chemical, dispensing the second chemical and dispensing the pH level neutralizing liquid.

10. A semiconductor wafer cleaning method, comprising:
dispensing a first chemical from two pairs of chemical dispensing tubes onto at least four locations on a semiconductor water within a first chemical treatment module, the two pairs of chemical dispensing tubes positioned at first positions from the wafer;
rotating a pair of brushes while in contact with the semiconductor wafer while the semiconductor wafer is positioned vertically in the first chemical treatment module, the wafer being between the pair of rotating brushes and the two pairs of chemical dispensing tubes; the pair of brushes and the two pairs of chemical dispensing tubes being oriented in substantially a same direction;
moving the two pairs of chemical dispensing tubes to be positioned at a second position from the wafer;
dispensing a second chemical that is different from the first chemical from the two pairs of chemical dispensing tubes onto at least four locations on the wafer within the first chemical treatment module with the two pairs of chemical dispensing tubes positioned at the second position from the wafer;
dispensing a third chemical that is different from the first chemical and the second chemical from the two pairs of chemical dispensing tubes onto at least four locations on the wafer within the first chemical treatment module with the two pairs of chemical dispensing tubes;
neutralizing a pH level on a surface of the semiconductor wafer with a liquid; and
spinning the semiconductor wafer in a dryer module.

11. The semiconductor wafer cleaning method of claim 10 wherein the second position is different than the first position.

12. The semiconductor wafer cleaning method of claim 10, further comprising:
removing the wafer from the first chemical treatment module;
moving the wafer to a second, separate chemical treatment module;
dispensing a third chemical onto at least two locations on the semiconductor wafer within the second, separate chemical treatment module using two different chemical dispensing tubes that are positioned and spaced apart from each other; and
rotating a pair of brushes while they are in contact with the semiconductor wafer while the semiconductor wafer is positioned vertically in the second chemical treatment module, the wafer being between the pair of rotating brushes.

13. The semiconductor wafer cleaning method of claim 10 wherein the step of neutralizing a pH level on a surface of the semiconductor wafer with a liquid comprises:
moving the wafer from the first chemical treatment module to a second, separate chemical treatment module.

14. A semiconductor wafer cleaning method, comprising:
dispensing a first chemical from four chemical dispensing tubes onto four locations on a semiconductor wafer within a first chemical treatment module, each chemical dispensing tube positioned a first distance from the semiconductor wafer;
rotating a pair of brushes while in contact with the semiconductor wafer while the semiconductor wafer is positioned vertically in the first chemical treatment module, the wafer being between the pair of brushes, two chemical dispensing tubes of the four chemical dispensing tubes being positioned on a first side of the semiconductor wafer, another two chemical dispensing tubes of the four chemical dispensing tubes being positioned on a second side of the semiconductor wafer;
moving the four chemical dispensing tubes to be, a second, different distance from the semiconductor wafer;
dispensing a second chemical from the four chemical dispensing tubes onto at least four locations on the semiconductor wafer within the first chemical treatment module with the four chemical dispensing tubes positioned at, the second, different distance from the wafer;
dispensing a pH neutralizing level liquid onto the first side and the second side of the semiconductor wafer;
dispensing a third chemical from the four chemical dispensing tubes onto at least four locations on the semiconductor wafer within the first chemical treatment module; and
spinning the semiconductor wafer in a dryer module;
wherein the first chemical is an acid, the second chemical has a neutral pH, and the third chemical is a base.

15. The semiconductor wafer cleaning method of claim 14 wherein the first, second and third chemicals are all cleaning chemicals that remove foreign material from the semiconductor wafer.

16. The semiconductor wafer cleaning method of claim 14 wherein dispensing the pH neutralizing level liquid onto the first side and the second side of the semiconductor wafer includes:
  moving the semiconductor wafer to a second, separate chemical treatment module; and
  applying the pH neutralizing level liquid to the surface of the semiconductor wafer.

* * * * *

UNITED STATES PATENT AND TRADEMARK OFFICE
CERTIFICATE OF CORRECTION

Page 1 of 1

PATENT NO. : 10,242,862 B2
APPLICATION NO. : 15/391135
DATED : March 26, 2019
INVENTOR(S) : John H. Zhang It is certified that error appears in the above-identified patent and that said Letters Patent is hereby corrected as shown below:

In the Claims

Column 11, Line 47:
"semiconductor water within a first chemical treatment" should read, -- semiconductor wafer within a first chemical treatment --.

Signed and Sealed this
Second Day of July, 2019

Andrei Iancu
*Director of the United States Patent and Trademark Office*